(12) United States Patent
Kitagawa et al.

(10) Patent No.: US 6,477,036 B2
(45) Date of Patent: Nov. 5, 2002

(54) TEMPERATURE COMPENSATING THIN-FILM CAPACITOR

(75) Inventors: Hitoshi Kitagawa, Miyagi-ken (JP); Makoto Sasaki, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/930,862

(22) Filed: Aug. 16, 2001

(65) Prior Publication Data

US 2002/0080551 A1 Jun. 27, 2002

(30) Foreign Application Priority Data

Aug. 25, 2000 (JP) .......................... 2000-25645

(51) Int. Cl.[7] .................. H01G 4/20; H01L 29/00; H01L 21/20
(52) U.S. Cl. .............. 361/312; 361/311; 361/321.1; 361/306.1; 257/532; 257/618; 438/396; 438/622
(58) Field of Search .............. 361/312, 321.1, 361/306.1, 311, 321.5, 306.2, 321.3, 321.4, 313; 257/532, 618; 438/396, 622

(56) References Cited

U.S. PATENT DOCUMENTS

| | | | |
|---|---|---|---|
| 3,819,990 A | * 6/1974 | Hayashi et al. | 317/258 |
| 4,423,087 A | * 12/1983 | Howard et al. | 427/79 |
| 4,548,910 A | 10/1985 | Irisawa | |
| 4,930,044 A | 5/1990 | Eda et al. | |
| 5,923,524 A | 7/1999 | Cava | |
| 5,978,207 A | * 11/1999 | Anderson et al. | 361/311 |
| 6,236,102 B1 | * 5/2001 | Kim et al. | 357/532 |

FOREIGN PATENT DOCUMENTS

JP 63-110618 5/1988

* cited by examiner

Primary Examiner—Dean A. Reichard
Assistant Examiner—Nguyen Ha
(74) Attorney, Agent, or Firm—Brinks Hofer Gilson & Lione

(57) ABSTRACT

The present invention provides a thin-film capacitor which can easily meet requirements of reduction in size, thickness, and weight and which can perform temperature compensation. In addition to the features described above, the present invention provides a thin-film capacitor having a superior Q factor in a high frequency band. The thin-film capacitor of the present invention has at least one first dielectric thin-film and at least one second dielectric thin-film having a dielectric constant different from that of the first dielectric thin-film, wherein these thin-films are provided between a pair of electrodes. In addition, in the present invention, the absolute value of the temperature coefficient of capacitance of the first dielectric thin-film is 50 ppm/° C. or less, and the temperature coefficient of capacitance of the second dielectric thin-film is a negative value and has an absolute value of 500 ppm/° C. or more.

9 Claims, 7 Drawing Sheets

TEMPERATURE COMPENSATING THIN-FILM CAPACITOR

BACKGROUND OF THE INVENTION

1. Field of the Invention

The present invention relates to thin-film capacitors used for compensating for the dependence of the junction capacitance of a semiconductor element on temperature so that the temperature dependence of an electronic circuit using the semiconductor element is decreased.

2. Description of the Related Art

A thin-film capacitor generally has a structure formed of a bottom electrode on a substrate, a dielectric layer, and a top electrode laminated in this order and, in some cases, has a structure formed of a semiconductor substrate serving as a bottom electrode, a dielectric layer, and a top electrode layer laminated in this order.

In this type of thin-film capacitor, it has been desired that the relative dielectric constant and the Q factor of the dielectric layer be large and that the temperature coefficient of the resonant frequency be either a positive or negative value close to zero.

Heretofore, as a dielectric composition having the properties described above, the material described below has been known. This dielectric composition is formed by firing a BaO—TiO2-based dielectric material mixed with samarium oxide ($Sm_2O_3$), gadolinium oxide ($Gd_2O_3$), dysprosium oxide ($Dy_2O_3$), or europium oxide ($Eu_2O_3$). However, according to techniques for obtaining this type of dielectric ceramic composition, the relative dielectric constant ∈·r and the temperature coefficient τ can only be controlled in the range of from 61 to 72 and in the range of from −24 to 31 ppm/° C., respectively.

Technical development has been conducted in view of the situation described above, and as a result, a dielectric ceramic composition is provided having a laminated structure formed by adhering a first dielectric ceramic composition sheet having a positive temperature coefficient of the resonant frequency to a second dielectric ceramic composition sheet having a negative temperature coefficient of the resonant frequency.

According to the technique described above, a mixture of starting materials used for forming a desired composition is molded so as to form a cylindrical body 16 mm in diameter and 9 mm thick, and this cylindrical body is fired at 1,260 to 1,450° C. for several hours, thereby forming the first dielectric composition. In addition, a mixture of starting materials different from that described above is molded and is then fired, thereby forming the second dielectric ceramic composition having the same dimensions as those described above. The two dielectric ceramic compositions thus formed are cut into sheets having a thickness of approximately 1 mm, and the sheets thus obtained are laminated to each other, so that a laminated dielectric ceramic composition is obtained.

In more particular, a desired relative dielectric constant and a desired temperature coefficient can be obtained by laminating dielectric ceramic compositions having the same relative dielectric constant or different relative dielectric constants from each other and by adjusting the volume ratio of the dielectric ceramic compositions described above.

According to the technique described above, since the structure is formed by laminating a plurality of sheets of the first dielectric ceramic composition and the second dielectric composition, each having a thickness of approximately 1 mm or less, the structure can be applied to a sheet-shaped laminated capacitor; however, it has been difficult to further miniaturize the capacitor or reduce the weight thereof. For example, a capacitor having a thickness of 1 mm or less cannot be formed, and hence, it has been difficult to form an even thinner capacitor.

In addition, when the sheets of the dielectric ceramic compositions are laminated to each other by using an adhesive, since the adhesive layer or an air layer having different dielectric properties is present at the interface between the sheets, a plurality of discontinuous portions is formed in the thickness direction of the laminated sheet structure. Consequently, it has been difficult to obtain a desired dielectric material having an ideal temperature coefficient.

Furthermore, since the dielectric ceramic composition in the form of a sheet is composed of a thick polycrystalline dielectric material, a number of crystalline grain boundaries are present in the thickness direction thereof, and as a result, it has been difficult to decrease the dielectric loss in a high frequency band of 1 GHz or more.

SUMMARY OF THE INVENTION

In view of the situations described above, the present invention was made, and an object of the present invention is to provide a thin-film capacitor which can easily satisfy the demand for a reduction in size, thickness, and weight, and which can also perform temperature compensation. In addition, another object of the present invention is to provide a thin-film capacitor having a superior Q factor in a high frequency band in addition to the features described above of the present invention. Furthermore, another object of the present invention is to provide a thin-film capacitor having a small leakage current.

In order to solve the problems described above, a thin-film capacitor according to the present invention comprises at least one first dielectric thin-film, at least one second dielectric thin-film having a relative dielectric constant different from that of the first dielectric thin-film, and a pair of electrodes, wherein the first thin-film and the second dielectric thin-film are provided between the pair of electrodes.

Since the said at least one first dielectric thin-film and the said at least one second dielectric thin-film having a relative dielectric constant different from that of the first dielectric thin-film are disposed between the pair of electrodes, by the combination of the dielectric thin-films described above, adjustment of the Q factor, adjustment of the withstand voltage, and the temperature compensation can be performed.

In the temperature compensating thin-film capacitor according to the present invention, it is preferable that the absolute value of the temperature coefficient of capacitance of the first dielectric thin-film be 50 ppm/° C. or less, and that the temperature coefficient of capacitance of the second dielectric thin-film be negative and have an absolute value of 500 ppm/° C. or more.

Since the dielectric thin-films each having the temperature coefficient of capacitance in the range described above are laminated to each other, the temperature coefficient can be adjusted, and the temperature compensation can be performed.

In the structure of the temperature compensating thin-film capacitor of the present invention, the second dielectric thin-film comprises a polycrystalline material having a number of crystalline grains forming a number of crystalline grains boundaries, and the number of the crystalline grain boundaries is preferably less than ten in the thickness direction of the second dielectric thin-film.

When the second dielectric thin-film has less than ten crystalline grain boundaries in the thickness direction thereof, and more preferably, when the second dielectric thin-film does not have a plurality of (for example, at least two) crystalline grain boundaries, a low dielectric loss in a high frequency band can be achieved, and a Q factor in a high frequency band can be increased.

In the structure of the present invention described above, the first dielectric thin-film preferably has a relative dielectric constant of 10 or less; a breakdown field strength (an electric field strength at which the current density is abruptly increased) of 5 MV/cm or more, and more preferably, 8 MV/cm or more; a Q factor of 200 or more, and more preferably, 500 or more at a frequency of 1 GHz or more; and a dielectric relaxation time of 1 second or more. Consequently, a thin-film capacitor having a smaller thickness and a higher withstand voltage can be obtained, and in addition, a thin-film capacitor suitably used for a high-frequency circuit can also be obtained.

In the structure of the present invention described above, the second dielectric thin-film preferably has a relative dielectric constant of 150 or less; and a Q factor of 50 or more, and more preferably, 100 or more at a frequency of 1 GHz or more.

In the structure of the present invention described above, the first dielectric thin-film preferably comprises $SiO_xN_y$.

In the structure of the present invention described above, the second dielectric thin-film preferably comprises one of $TiO_x$ and $CaTiO_3$.

When the first dielectric thin-film comprises $SiO_xN_y$, a superior withstand voltage and a high Q factor can be easily obtained, and when the second dielectric thin-film comprises $TiO_x$ or $CaTiO_3$, the temperature coefficient of capacitance can be easily adjusted by controlling the thickness thereof.

In the structure of the present invention described above, as the dielectric thin-films disposed between the pair of electrodes, the first dielectric thin-films are each preferably provided on each electrode, and the second dielectric thin-film is preferably provided between the first dielectric thin-films.

When the first dielectric thin-films each comprises $SiO_xN_y$ and are each provided on each electrode, the withstand voltage can be increased, and the current leakage can be reduced. In addition, when the second dielectric thin-film is provided between the pair of first dielectric thin-films, the temperature coefficient can be easily controlled.

DESCRIPTION OF THE PREFERRED EMBODIMENTS

Hereinafter, embodiments of the present invention will be described with reference to the accompanying drawings; however, the present invention is not limited to the embodiments described below.

Figure 1:
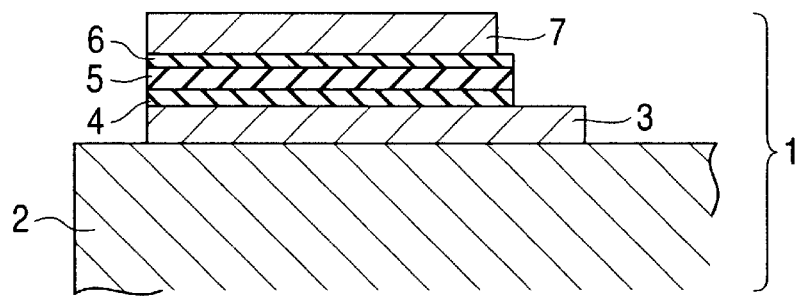
FIG. 1 is a cross-sectional view of the structure of a temperature compensating capacitor according to a first embodiment of the present invention.
Figure 2:
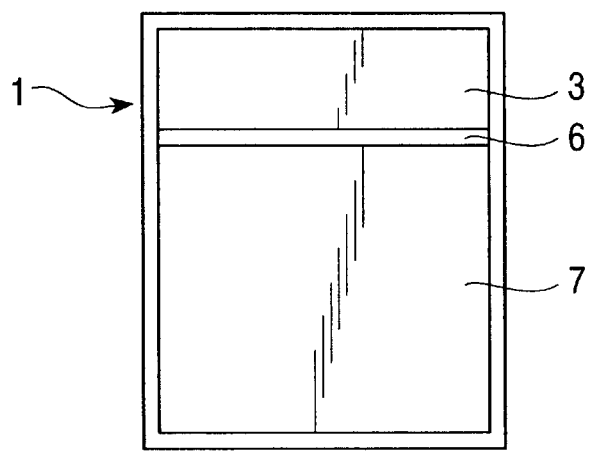
FIG. 2 is a plan view of the thin-film capacitor shown in FIG. 1.

FIG. 1 shows a thin-film capacitor according to a first embodiment of the present invention, and in a thin-film capacitor 1 of this first embodiment, on one surface of a rectangular substrate 2 in plan view, a thin first electrode layer (a lower electrode layer) 3, a first dielectric thin-film 4, a second dielectric thin-film 5, a first dielectric thin-film 6, and a thin second electrode layer (an upper electrode layer) 7 are laminated in this order.

The substrate 2 is not required to have specific properties and is not formed of a specific material, and any material may be used therefor as long as the substrate 2 has a sufficient thickness imparting an adequate rigidity to the entire capacitor and has resistance against processing temperatures for forming the thin first electrode layer 3, the first dielectric thin-film 4, the second dielectric thin-film 5, the first dielectric thin-film 6, and the thin second electrode layer 7. As a material which can meet the requirements described above, a material having silicon on the surface thereof, such as a silicon wafer or $SiO_2$, or $Al_2O_3$ may be mentioned by way of example.

The first electrode layer 3 and the second electrode layer 7 may have a monolayer structure composed of a metal itself, such as copper (Cu), silver (Ag), gold (Au), or platinum (Pt) or may have a laminated structure composed of a plurality of metal layers. The laminated structure may be formed of layers composed of a silicon oxide, chromium (Cr), nickel (Ni), a chromium oxide, a nickel oxide, or platinum (Pt), or may be formed of at least two layers mentioned above.

The first dielectric films 4 and 6 are composed of the same material, and the material therefor preferably has a higher withstand voltage, a higher Q factor, and a lower temperature coefficient than those of the second dielectric thin-film 5 described below.

In more particular, in the first dielectric thin-films 4 and 6, it is preferable that the absolute value of the temperature coefficient of capacitance be 50 ppm/° C. or less; the relative dielectric constant be 10 or less; the breakdown field strength be 5 MV/cm or more, and more preferably, be 8 MV/cm or more; the non-loading Q factor be 200 or more, and more preferably, be 500 or more (at a frequency of 1 GHz or more); and the dielectric relaxation time be 1 second or more. The thicknesses of the first dielectric thin-films 4 and 6 are each preferably 1 μm (1×10$^{-6}$ m) or less, and more preferably, are each in the range of approximately 500 to 5,000 Å (0.05 to 0.5 μm). The reasons for this are that the withstand voltage is ensured, and a thin-film capacitor having a smaller thickness and high productivity is realized.

In addition, as a material for fulfilling the requirements described above, for example, an amorphous SiO$_x$N$_y$ layer or a SiO$_x$ layer may be mentioned. This amorphous SiO$_x$N$_y$ layer may be formed by a film-forming method, such as a sputtering method or a plasma-enhanced chemical vapor deposition (PEDVD) method.

The second dielectric thin-film 5 may be inferior to the first dielectric thin-films 4 and 6 to some extent in terms of the withstand voltage and the Q factor but preferably has a higher temperature coefficient than that of the first dielectric thin-films 4 and 6.

In more particular, in the second dielectric thin-film 5, it is preferable that the temperature coefficient of the capacitance be negative, and the absolute value thereof be 500 ppm/° C. or more; the relative dielectric constant be 150 or less; the non-loading Q factor be 50 or more, and more preferably, be 100 or more (at a frequency of 1 GHz or more); and the dielectric relaxation time be 1 second or more. The thickness of the second dielectric thin-film 5 is preferably 2 μm (2×10$^{-6}$ m) or less, and more preferably, is 1 μm (1×10$^{-6}$ m) or less. The reason for this is that when the particle diameter of crystalline grains constituting the second dielectric thin-film 5 is in the range of from 0.5 to 1 μm, a plurality of crystalline grain boundaries is not formed in the film thickness direction.

In more particular, the reason for this is that when the particle diameter of the crystalline grains constituting the second dielectric thin-film 5 is in the range of from 0.1 to 0.5 μm, ten crystalline grain boundaries or more are not formed in the thickness direction. It is preferable that a smaller number of the crystalline grain boundaries be present in the thickness direction is preferable, it is more preferable that two grain boundaries or less be present if possible, and ideally, it is most preferable that the crystalline grain boundary be not present in the thickness direction at all (that is, a state in which only one crystalline grain is present in the thickness direction).

In addition, as a layer composed of a material which can satisfy these requirements, a TiO$_2$ layer or a CaTiO$_3$ layer may be mentioned by way of example. The TiO$_2$ layer or the CaTiO$_3$ layer has a high negative temperature coefficient and is provided in order to adjust the temperature coefficient of the first dielectric thin-films 4 and 6 described above, and the layer described above has a lower withstand voltage than that of the first dielectric thin-films 4 and 6 and has some probability of causing the generation of current leakage. However, since the first dielectric thin-films 4 and 6 having a high withstand voltage are provided at the electrode layers 3 and 7 sides, respectively, the thin-film capacitor will not have any problems of the withstand voltage characteristic. The TiO$_2$ layer or the CaTiO$_3$ layer may be formed by a film-forming method such as a sputtering method.

Since the thin-film capacitor 1 has the structure in which the first dielectric thin-films 4 and 6 having a superior withstand voltage characteristic are disposed so as to be in contact with the electrode layers 3 and 7, respectively, the thin-film capacitor 1 has a superior withstand voltage characteristic. In addition, since the thin-film capacitor 1 has a laminated structure composed of the first dielectric thin-films 4 and 6 and the second dielectric thin-film 5 provided therebetween, a thinner and a miniaturized capacitor can be advantageously formed compared to a laminated structure formed of a sheet-shaped conventional dielectric ceramic composition, and hence, a capacitor having a thickness of approximately 5 μm (5×10$^{-6}$ m) or less can be easily formed. Furthermore, when the thicknesses and the volumes of the first dielectric thin-films 4 and 6 and the second dielectric thin-film 5 are adjusted, the Q factor, the withstand voltage, the temperature coefficient of capacitance of the capacitor can be adjusted, and as a result, a capacitor can be formed having a lower temperature coefficient even when used under conditions in which the temperature significantly varies.

As described above, the thin-film capacitor having the structure shown in FIG. 1 is effectively used in a circuit of an electronic apparatus, such as a portable electronic apparatus or a microwave communication apparatus, in which compensation must be performed in accordance with a change in temperature. For example, the thin-film capacitor can be used in combination with a varactor diode which controls oscillation frequency by voltage.

Figure 3:
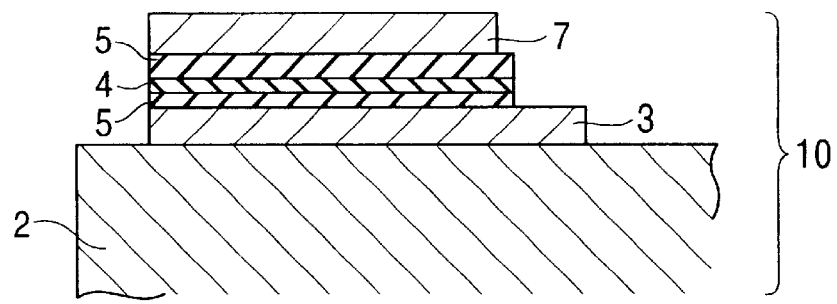
FIG. 3 is a cross-sectional view of the structure of a temperature compensating capacitor according to a second embodiment of the present invention.

FIG. 3 is a view showing a thin-film capacitor according to a second embodiment of the present invention, and a thin-film capacitor 10 of this embodiment has a structure in which on a substrate 2, a bottom electrode layer 3, a second dielectric thin-film 5, a first dielectric thin-film 4, a second dielectric thin-film 5, and a top electrode layer 7 are sequentially laminated in this order.

In the structure shown in FIG. 3, the temperature coefficient of the entire thin-film capacitor 10 can also be controlled by the difference in temperature coefficient between the first dielectric thin-film 4 and the second dielectric thin-films 5 and 5, and hence, an effect equivalent to that described in the first embodiment can be obtained.

Figure 4:
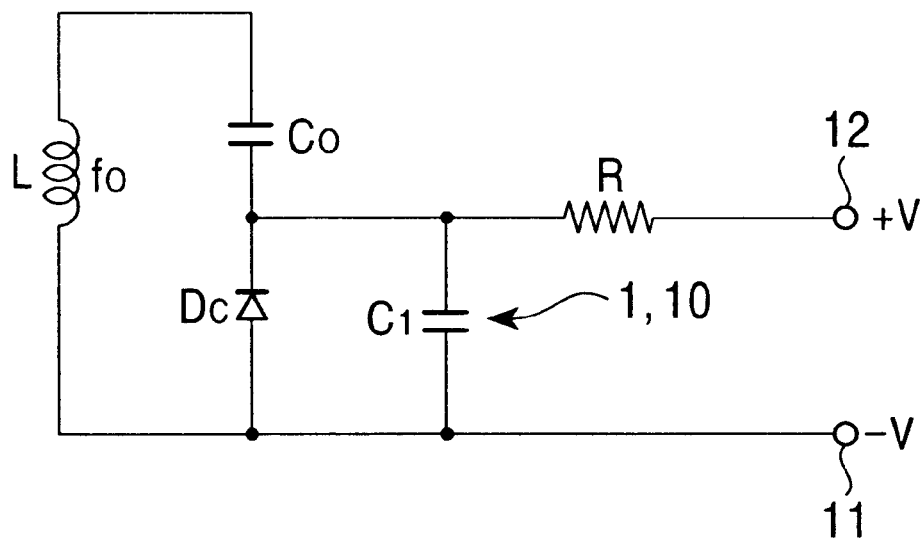
FIG. 4 is a circuit diagram showing an example of an electrical circuit provided with a thin-film capacitor of the present invention.

FIG. 4 shows a structural example of a practical electrical circuit incorporating a thin-film capacitor C$_1$ formed of a thin-film capacitor 1 or 10 of the present invention. This circuit has a structure in which a capacitor C$_0$ and a varactor diode Dc are connected in series so that they are in parallel with respect to a coil L, the thin-film capacitor C$_1$ of the first embodiment is connected in parallel to the varactor diode Dc, input/output terminals 11 and 12 are connected to the top electrode 7 and the bottom electrode 3 of the thin-film capacitor C$_1$, respectively, and a resistor R is provided between the input/output terminal 12 and one electrode of the thin-film capacitor C$_1$.

In the circuit shown in FIG. 4, since the varactor diode Dc is an element in which the capacitance thereof varies in accordance with a voltage applied thereto and has a predetermined positive temperature coefficient, when the temperature coefficient of this varactor diode is canceled by that of the thin-film capacitor C$_1$, whereby a resonant circuit having a lower temperature coefficient can be provided.

Figure 5:
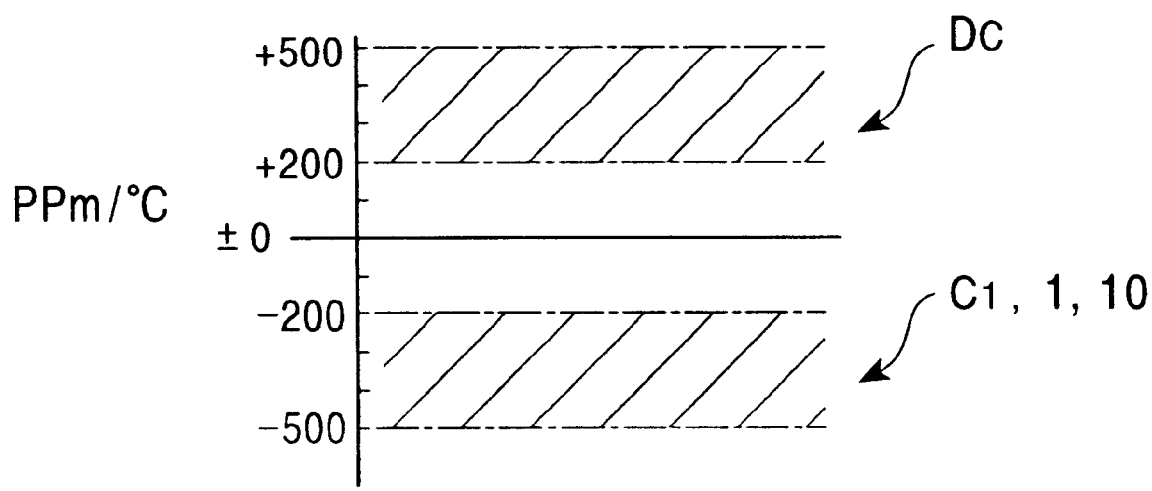
FIG. 5 is a view showing a temperature coefficient of a thin-film capacitor of the present invention and a temperature coefficient of a varactor diode.

The ranges of the temperature coefficients of these elements are shown in FIG. 5. When the temperature coefficient of the varactor diode Dc is in the range of from +200 to +500 ppm/° C., and the temperature coefficient of the thin-film capacitor C$_1$ is in the range of from −200 to −500 ppm/° C., the temperature coefficient of the circuit can be decreased by adjusting both temperature coefficients. According to the patent described above, a capacitor having a temperature coefficient, which is widely adjustable in the range of from −200 to −500 ppm/° C., cannot be obtained.

This type of thin-film capacitor can be broadly used for temperature compensation, such as a temperature compensation circuit for a varactor diode.

EXAMPLES

A bottom electrode 1.3 μm (1.3×10$^{-6}$ m) thick composed of copper (Cu) was formed by sputtering at room temperature on a substrate composed of alumina or a glass. Next, a laminated thin-film capacitor was obtained by steps of forming an amorphous $SiO_xN_y$ layer (a first dielectric thin-film) 500 to 1,700 Å thick by a PECVD method at 300° C. on this bottom electrode, forming a $TiO_2$ layer (a second dielectric thin-film) 4,600 to 10,000 Å thick by sputtering at room temperature, forming an amorphous $SiO_xN_y$ layer (the first dielectric thin-film) 500 to 1,700 Å thick by a PECVD method at 300° C., and forming a top electrode 1.3 μm ($1.3\times10^{-6}$ m) thick composed of Cu by sputtering at room temperature. The setting value of a sheet capacitance of this thin-film capacitor was 120 pF/mm².

TABLE 1

| Thickness of Second Dielectric Layer $TiO_2$ (Å) | Composition of First Dielectric Layer $SiO_xN_Y$ | Thickness of First Dielectric Layer (Total of Two Layers) $SiO_xN_Y$ (Å) | Capacitor Q Factor (1.5 GHz) | Withstand Voltage (V) | Temperature Coefficient of Capacitance ppm/° C. |
|---|---|---|---|---|---|
| 4,600 | X = 1.9, Y = 0 | 2,200 | 183 | 266 | −220 |
| 4,600 | X = 1.4, Y = 0.3 | 2,600 | 179 | 306 | −220 |
| 4,600 | X = 0, Y = 1.3 | 3,400 | 175 | 386 | −220 |
| 7,000 | X = 1.9, Y = 0 | 1,700 | 180 | 240 | −330 |
| 7,000 | X = 1.4, Y = 0.3 | 2,000 | 177 | 270 | −330 |
| 7,000 | X = 0, Y = 1.3 | 2,600 | 173 | 330 | −330 |
| 10,000 | X = 1.9, Y = 0 | 1,000 | 176 | 200 | −470 |
| 10,000 | X = 1.4, Y = 0.3 | 1,300 | 174 | 230 | −470 |
| 10,000 | X = 0, Y = 1.3 | 1,600 | 171 | 260 | −470 |

As can be seen from the results shown in Table 1 above, by adjusting the thickness of the second dielectric thin-film in the range of from 4,600 to 10,000 Å, the thickness of the first dielectric thin-film in the range of from 1,000 to 3,400 Å, and the composition ratio, it was understood that the Q factor, the withstand voltage, and the temperature coefficient of capacitance could be controlled in the range of from 173 to 183, 200 to 386 V, and −220 to −470 ppm/° C., respectively. According to the thin-film capacitor of this example, the temperature coefficient of the capacitance can be controlled in the range of from −220 to −470 ppm/° C., and hence, this thin-film capacitor can be used as an element used for temperature compensation of an electronic device having a positive temperature coefficient, such as a varactor diode.

Figure 6:
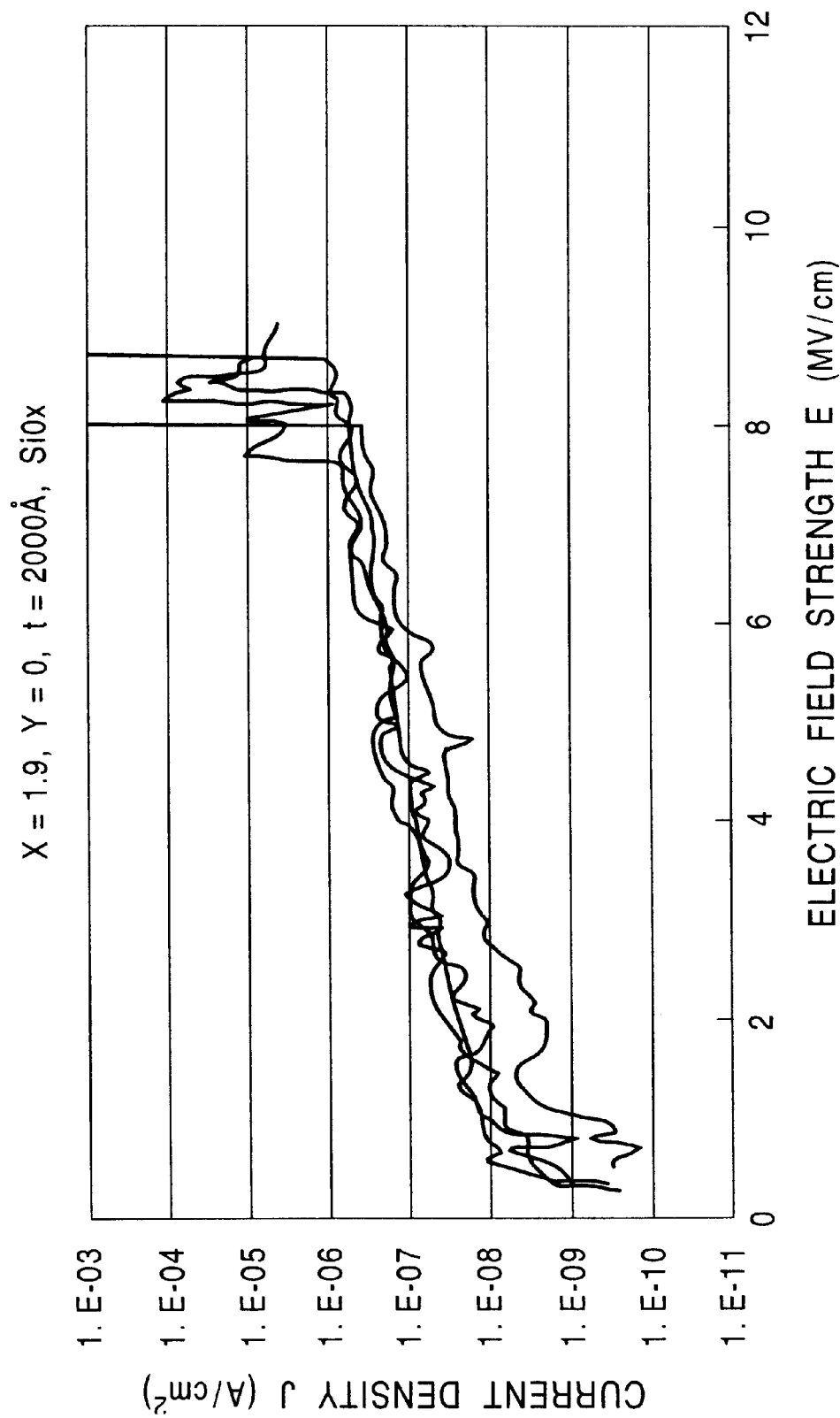
FIG. 6 is a graph showing the relationship between the electric field strength and the current density of a $SiO_x$ film (X=1.9, and Y=0) having a thickness of 2,000 Å.
Figure 7:
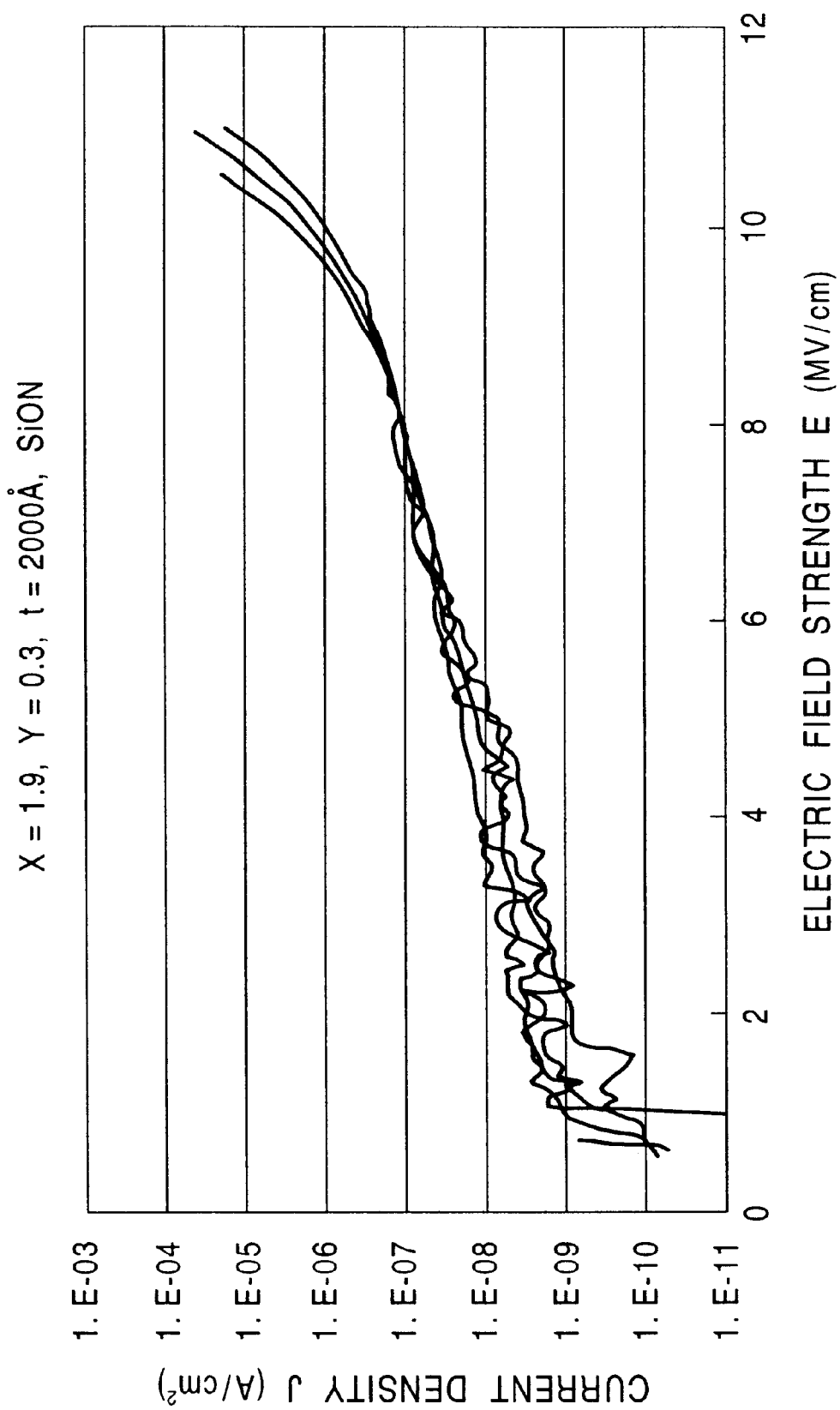
FIG. 7 is a graph showing the relationship between the electric field strength and the current density of a $SiO_xN_y$ film (X=1.4, and Y=0.3) having a thickness of 2,000 Å.
Figure 8:
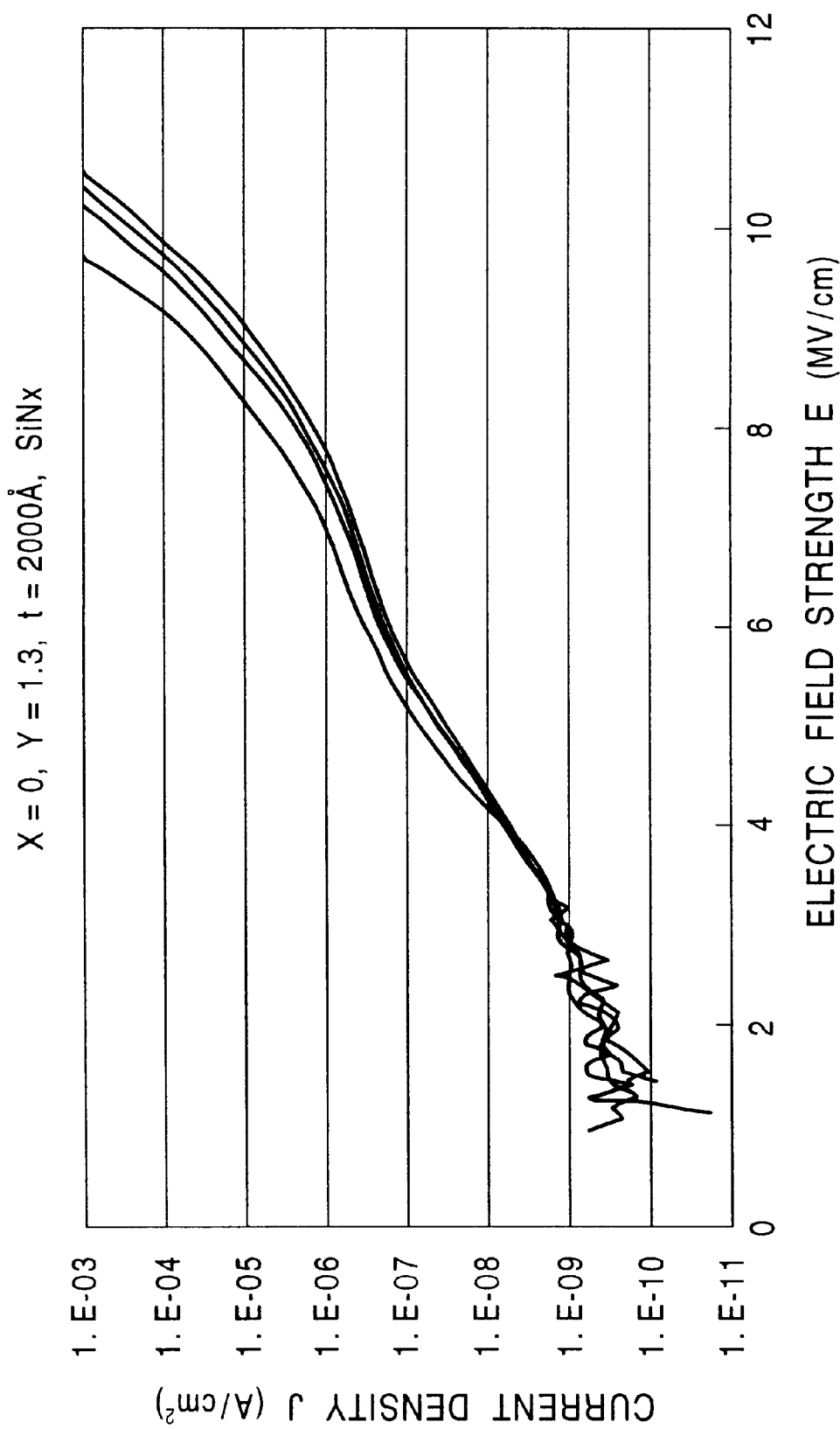
FIG. 8 is a graph showing the relationship between the electric field strength and the current density of a $SiN_y$ film (X=0, and Y=1.3) having a thickness of 2,000 Å.
Figure 9:
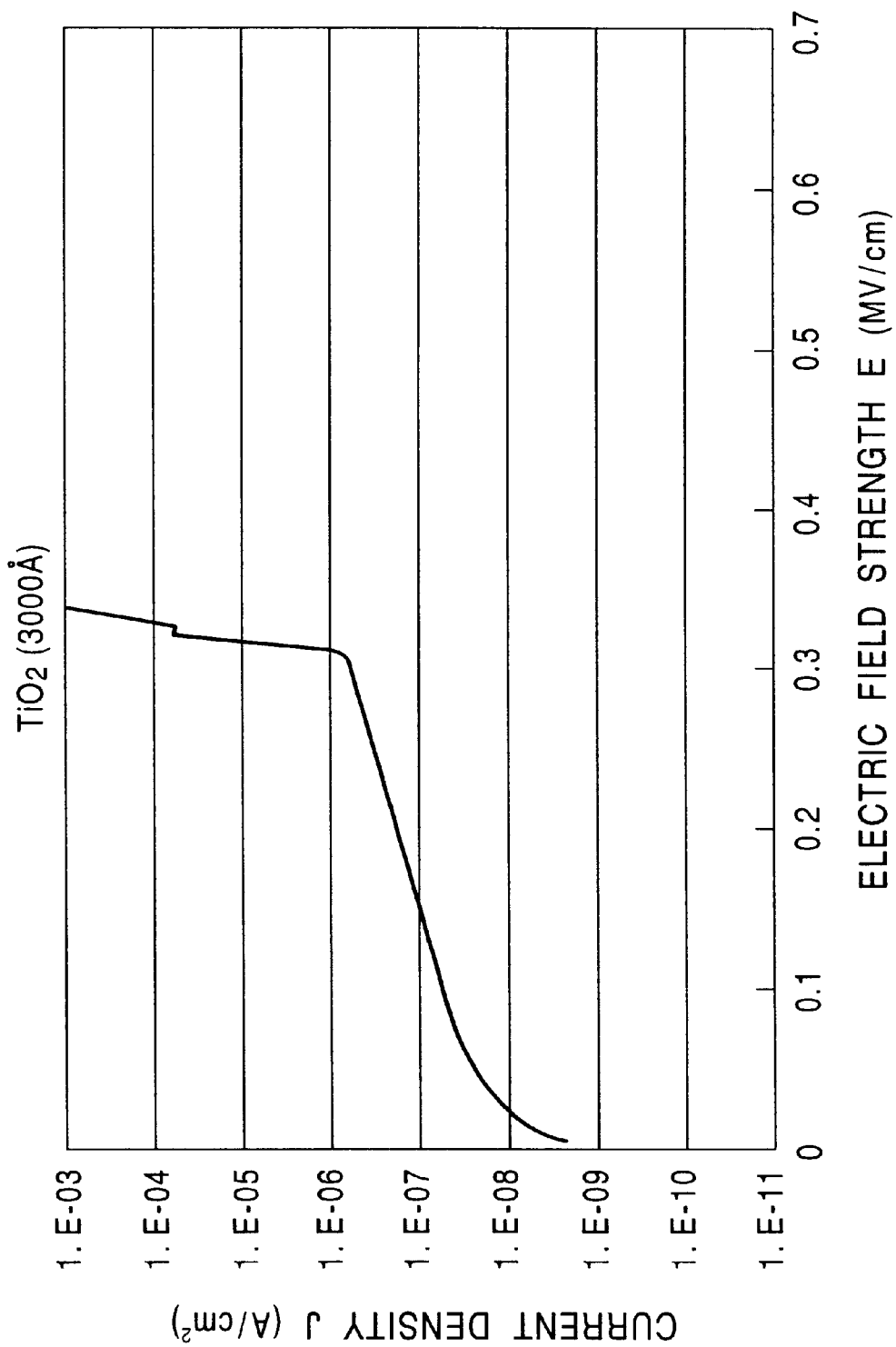
FIG. 9 is a graph showing the relationship between the electric field strength and the current density of a $TiO_2$ film having a thickness of 3,000 Å.
Figure 10:
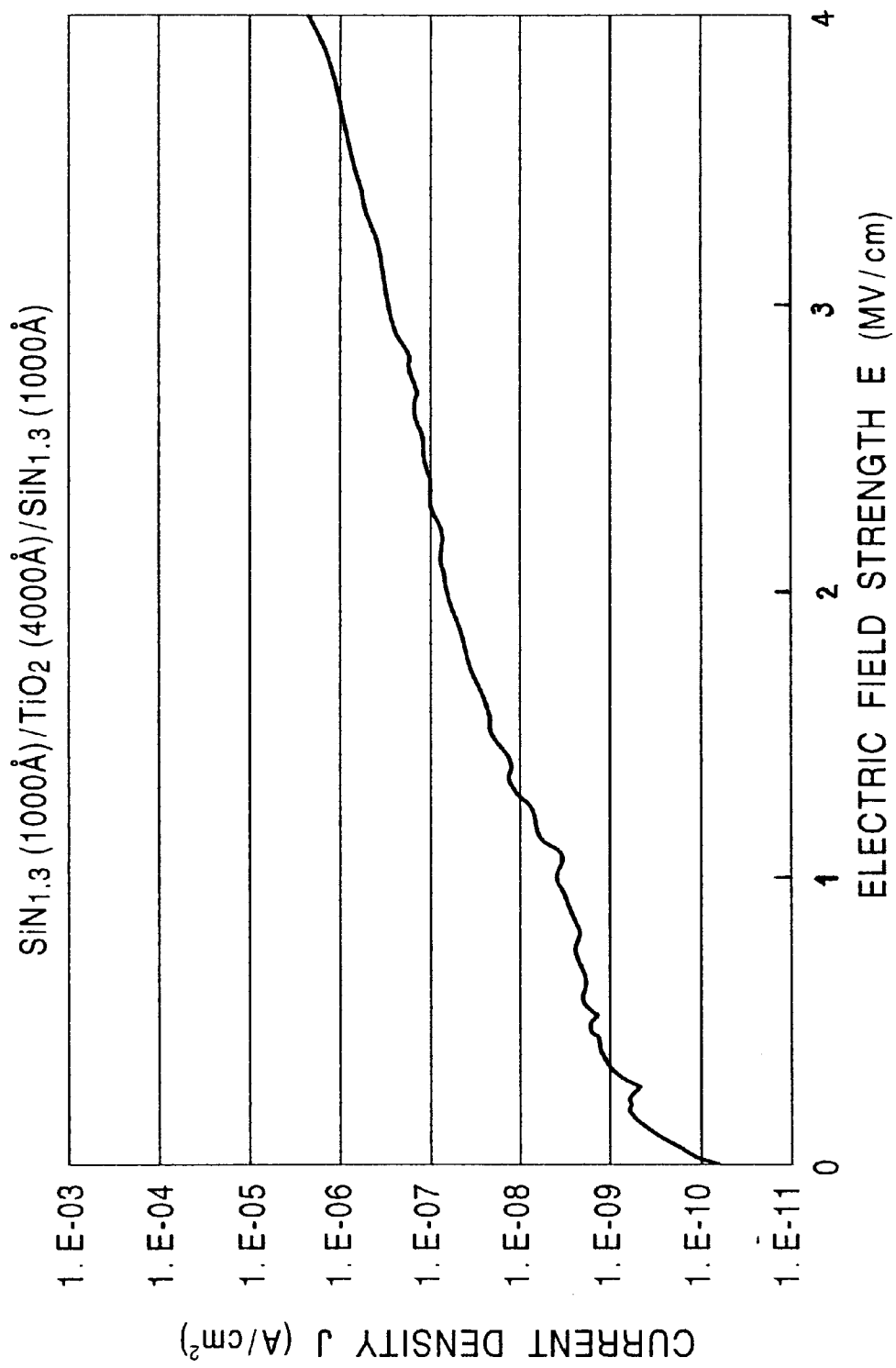
FIG. 10 is a graph showing the relationship between the electric field strength and the current density of the thin-film capacitor shown in FIG. 1.

Next, the relationship between the electric field strength and the current density of a $SiO_x$ film (X=1.9, Y=0) 2,000 Å thick is shown in FIG. 6, the relationship between the electric field strength and the current density of a $SiO_xN_y$ film (X=1.4, Y=0.3) 2,000 Å thick is shown in FIG. 7, the relationship between the electric field strength and the current density of a $SiN_y$ film (X=0, Y=1.3) 2,000 Å thick is shown in FIG. 8, the relationship between the electric field strength and the current density of a $TiO_2$ film 3,000 Å thick is shown in FIG. 9, and the relationship between the electric field strength and the current density of a thin-film capacitor having a three-layered structure ($SiN_{1.3}$ film/$TiO_2$ film/$SiN_{1.3}$ film) is shown in FIG. 10.

According to the results shown in FIGS. 6 to 8, it was understood that the breakdown field strength of every $SiO_xN_y$ film was 8 MV/cm or more. According to the result shown in FIG. 9, it was understood that a single-layered $TiO_2$ film 3,000 Å thick had a breakdown field strength of approximately 0.3 MV/cm. However, according to the result shown in FIG. 10, it was understood that when a $TiO_2$ film having a breakdown field strength of 0.3 MV/cm was sandwiched by the $SiO_xN_y$ films shown in FIGS. 6 to 8, a thin-film capacitor having a breakdown field strength of 3 MV/cm or more could be obtained.

When the breakdown field strength is more than 3 MV/cm or more, the withstand voltage is 180 V or more (3 MV/cm× $6\times10^{-5}$ cm (6,000 Å)=180 V), and hence, a thin-film capacitor having the three-layered structure described above can be used for a typical electronic circuit which is required to have a withstand voltage of 100 V or more.

In FIG. 6, the dielectric breakdown occurred at approximately 8 MV/cm. In contrast, in FIGS. 7 and 8, the dielectric breakdown did not occur; however, Poole-Frenkel conduction occurred at approximately 8 MV/cm or more. In FIG. 9, the dielectric breakdown occurred at more than 0.3 MV/cm. In addition, in FIG. 10, it can be regarded as that the dielectric breakdown did not occur even at 4 MV/cm.

As has thus been described, in the thin-film capacitor according to the present invention, since at least one first dielectric thin-film and at least one second dielectric thin-film having a dielectric constant different from that of the first dielectric thin-film are disposed between a pair of electrodes, adjustment of the Q factor and the withstand voltage, and the temperature compensation can be performed by various combination of these two types of dielectric thin-films.

In the present invention, in addition to the structure described above, when the absolute value of the temperature coefficient of capacitance of the first dielectric thin-film is 50 ppm/° C. or less, the temperature coefficient of capacitance of the second dielectric thin-film is negative, and the absolute value thereof is 500 ppm/° C. or more, adjustment of the temperature coefficient of the capacitor can be performed, and the capacitor can be used for temperature compensation applications.

In the structure of the thin-film capacitor of the present invention, when the second dielectric thin-film is composed of a polycrystalline material, and a plurality of crystalline grain boundaries formed of the crystalline grains in the polycrystalline material is not present in the thickness direction, a lower dielectric loss can be achieved in a high frequency band, and a Q factor in a high frequency band can be improved.

In the present invention, the first dielectric thin-film can be formed so as to have a relative dielectric constant of 10 or less; a breakdown field strength of 5 MV/cm or more, and more preferably, 8 MV/cm or more; a Q of 200 or more, and more preferably, 1,000 or more at a frequency of 1 GHz or more; and a dielectric relaxation time of 1 second or more.

In the present invention, the second dielectric thin-film can be formed so as to have a relative dielectric constant of 150 or less; and a Q of 50 or more, and more preferably, 100 or more at a frequency of 1 GHz or more.

In the present invention, when the first dielectric thin-film comprises $SiO_xN_y$, by adjusting the composition ratio and the thickness thereof, adjustment of the Q factor, the withstand voltage, the temperature coefficient can be easily performed, and when the second dielectric thin-film comprises $TiO_x$, by adjusting the thickness thereof, adjustment of the temperature coefficient of capacitance can be easily performed.

What is claimed is:

1. A temperature compensating thin-film capacitor comprising:
   at least one first dielectric thin-film having a thickness of 1 μm or less and wherein the first dielectric thin-film comprises $SiO_xN_y$; wherein x is in the range of 0 to 1.9, and y is in the range of 0 to 1.3
   at least one second dielectric thin-film having a relative dielectric constant different from that of the first dielectric thin-film having a thickness of 2 μm or less and wherein the second dielectric thin-film comprises one of $TiO_x$ and $CaTiO_3$; and
   a pair of electrodes;
   wherein the first dielectric thin-film and the second dielectric thin-film are disposed between the pair of electrodes.

2. A temperature compensating thin-film capacitor according to claim 1, wherein the absolute value of the temperature coefficient of capacitance of the first dielectric thin-film is 50 ppm/° C. or less, and the temperature coefficient of capacitance of the second dielectric thin-film is negative and has an absolute value of 500 ppm/=° C. or more, the first dielectric thin-films being produced by forming an amorphous $SiO_xN_y$ layer 500 to 1,700 Å thick by a plasma-enhanced chemical vapor deposit method at 300° C. and the second dielectric thin-film being produced by forming a $TiO_2$ layer 4,600 to 10,000 Å thick by sputtering at room temperature.

3. A temperature compensating thin-film capacitor according to claim 2, wherein the second dielectric thin-film comprises a polycrystalline material having a number of crystalline grains which form a number of crystalline grain boundaries, and the number of the crystalline grain boundaries is less than ten in the thickness direction of the second dielectric thin-film;
   the first dielectric thin-film has a relative dielectric constant of 10 or less, a breakdown field strength of 5 MV/cm or more, a Q factor of 200 or more at a frequency of 1 GHz or more, and a dielectric relaxation time of 1 second or more; and
   the second dielectric thin-film has a relative dielectric constant of 150 or less, and a Q factor of 50 or more at a frequency of 1 GHz or more.

4. A temperature compensating thin-film capacitor according to claim 1, wherein, as the first and the second thin-films disposed between the pair of electrodes, the first dielectric thin-films are each provided on each electrode, and the second dielectric thin-film is provided between the first dielectric thin-films;
   the first dielectric thin-film has a relative dielectric constant of 10 or less, a breakdown field strength of 5 MV/cm or more, a Q factor of 200 or more at a frequency of 1 GHz or more, and a dielectric relaxation time of 1 second or more; and
   the second dielectric thin-film has a relative dielectric constant of 150 or less, and a Q factor of 50 or more at a frequency of 1 GHz or more.

5. A temperature compensating thin-film capacitor according to claim 4, wherein the absolute value of the temperature coefficient of capacitance of the first dielectric thin-film is 50 ppm/° C. or less, and the temperature coefficient of capacitance of the second dielectric thin-film is negative and has an absolute value of 500 ppm/° C. or more.

6. A temperature compensating thin-film capacitor according to claim 5, wherein the second dielectric thin-film comprises a polycrystalline material having a number of crystalline grains which form a number of crystalline grain boundaries, and the number of the crystalline grain boundaries is less than ten in the thickness direction of the second dielectric thin-film.

7. An electrical circuit comprising a thin-film capacitor as set forth in claim 4 that is connected in parallel with a varactor diode having a predetermined positive temperature coefficient to thus provide a resonant circuit having a lower temperature coefficient than said predetermined positive temperature coefficient.

8. An electrical circuit comprising a thin-film capacitor as set forth in claim 5 that is connected in parallel with a varactor diode having a predetermined positive temperature coefficient to thus provide a resonant circuit having a lower temperature coefficient than said predetermined positive temperature coefficient.

9. An electrical circuit comprising a thin-film capacitor as set forth in claim 6 that is connected in parallel with a varactor diode having a predetermined positive temperature coefficient to thus provide a resonant circuit having a lower temperature coefficient than said predetermined positive temperature coefficient.

* * * * *

UNITED STATES PATENT AND TRADEMARK OFFICE
CERTIFICATE OF CORRECTION

PATENT NO. : 6,477,036 B2
DATED : November 5, 2002
INVENTOR(S) : Hitoshi Kitagawa et al.

It is certified that error appears in the above-identified patent and that said Letters Patent is hereby corrected as shown below:

Title page,
Item [30], Foreign Application Priority Data, delete "2000-25645" and substitute -- 2000-256405 -- in its place.

Item [57], ABSTRACT,
Rewrite the "ABSTRACT" as follows:
-- A thin-film capacitor which can be reduced in size, thickness, and weight relative to current thin-film capacitors and which can perform temperature compensation. In addition to the features described above, the present invention provides a thin-film capacitor having a superior Q factor in a high frequency band. This thin-film capacitor has at least one first dielectric thin-film and at least one second dielectric thin-film having a dielectric constant different from that of the first dielectric thin-film, and these thin-films are provided between a pair of electrodes. In addition, the absolute value of the temperature coefficient of capacitance of the first dielectric thin-film is 50 ppm/°C or less, and the temperature coefficient of capacitance of the second dielectric thin-film is a negative value and has an absolute value of 500 ppm/°C or more. --.

Column 9,
Line 32, delete "500 ppm/=° C." and substitute -- 500 ppm/°C. -- in its place.

Signed and Sealed this

Tenth Day of June, 2003

JAMES E. ROGAN
*Director of the United States Patent and Trademark Office*